US010710526B2

(12) United States Patent
Kawauchi (10) Patent No.: US 10,710,526 B2
(45) Date of Patent: Jul. 14, 2020

(54) BATTERY APPARATUS, VEHICLE, AND AUTOMATIC VEHICLE

(71) Applicant: GS Yuasa International Ltd., Kyoto (JP)

(72) Inventor: Tomohiro Kawauchi, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 176 days.

(21) Appl. No.: 16/072,753

(22) PCT Filed: Jan. 31, 2017

(86) PCT No.: PCT/JP2017/003254
§ 371 (c)(1),
(2) Date: Jul. 25, 2018

(87) PCT Pub. No.: WO2017/135202
PCT Pub. Date: Aug. 10, 2017

(65) Prior Publication Data
US 2019/0031126 A1 Jan. 31, 2019

(30) Foreign Application Priority Data

Feb. 2, 2016 (JP) .................................. 2016-017733

(51) Int. Cl.
*B60R 16/033* (2006.01)
*B60R 16/03* (2006.01)
(Continued)

(52) U.S. Cl.
CPC ............ *B60R 16/033* (2013.01); *B60R 16/03* (2013.01); *G01R 31/382* (2019.01); *H01M 2/34* (2013.01);
(Continued)

(58) Field of Classification Search
CPC ...... B60R 16/033; B60R 16/03; G01R 31/382; H01M 2/34; H01M 2/341; H01M 10/0525;
(Continued)

(56) References Cited

U.S. PATENT DOCUMENTS

2004/0109274 A1 6/2004 Sato
2008/0158755 A1 7/2008 Sato
(Continued)

FOREIGN PATENT DOCUMENTS

JP S6274455 U 5/1987
JP H07-013585 3/1995
(Continued)

OTHER PUBLICATIONS

International Searching Authority, International Search Report (ISR) and Written Opinion for International Application No. PCT/JP2017/003254, 9 pages, Japan Patent Office, Japan.

*Primary Examiner* — Hal Kaplan
(74) *Attorney, Agent, or Firm* — Alston & Bird LLP (57) ABSTRACT

The present invention reduces the effort involved in an operation for cancelling a current cutoff device while inhibiting a capacity decline during parking. Provided is a battery device 20 that is to be mounted on a vehicle, and that is provided with: an assembled battery 30 that supplies electric power to loads 10 including an engine starting device 10A; a current cutoff device 45 that cuts off an electric current to the loads 10 from the assembled battery 30; and a control unit 70, wherein upon detecting a parked state of the vehicle, the control unit 70 operates the current breaker device 45 so as to execute a current cutoff process for cutting off the current flowing from the assembled battery 30 to the loads 10, and following the execution of the current cutoff process, if a prior action to be performed on the vehicle by a user before starting driving is detected, the control unit 70
(Continued)

cancels the cutoff of current by cancelling the operation of the current breaker device 45.

14 Claims, 9 Drawing Sheets

(51) Int. Cl.
*H02J 7/14* (2006.01)
*H02H 7/18* (2006.01)
*G01R 31/382* (2019.01)
*H02J 7/00* (2006.01)
*H01M 10/44* (2006.01)
*H01M 2/34* (2006.01)
*H01M 10/42* (2006.01)
*H01M 10/48* (2006.01)
*H01M 10/0525* (2010.01)

(52) U.S. Cl.
CPC ............ *H01M 10/425* (2013.01); *H02H 7/18* (2013.01); *H02J 7/0032* (2013.01); *H02J 7/0088* (2013.01); *H02J 7/1446* (2013.01); *H01M 2/341* (2013.01); *H01M 10/0525* (2013.01); *H01M 10/44* (2013.01); *H01M 10/48* (2013.01); *H01M 2010/4271* (2013.01); *H01M 2200/00* (2013.01); *H01M 2220/20* (2013.01)

(58) Field of Classification Search
CPC .... H01M 10/425; H01M 10/44; H01M 10/48; H01M 2010/4271; H01M 2200/00; H01M 2200/20; H02H 7/18; H02J 7/0032; H02J 7/0088; H02J 7/1446
USPC .......................................................... 307/10.1
See application file for complete search history.

(56) References Cited

U.S. PATENT DOCUMENTS

| | | |
|---|---|---|
| 2010/0082198 A1 | 4/2010 | Arai et al. |
| 2014/0104739 A1 | 4/2014 | Nakamoto et al. |
| 2016/0250928 A1 | 9/2016 | Matsuda |

FOREIGN PATENT DOCUMENTS

| | | |
|---|---|---|
| JP | H08197978 A | 8/1996 |
| JP | H1140205 A | 2/1999 |
| JP | 2001352687 A | 12/2001 |
| JP | 2003272717 A | 9/2003 |
| JP | 2004227780 A | 8/2004 |
| JP | 2010076595 A | 4/2010 |
| JP | 2010285122 A | 12/2010 |
| JP | 2013243881 A | 12/2013 |
| JP | 2014023228 A | 2/2014 |
| JP | 2014096975 A | 5/2014 |
| JP | 2015070681 A | 4/2015 |
| JP | 2015115219 A | 6/2015 |
| WO | WO 2001/86735 A2 | 11/2001 |
| WO | WO 2013/176085 A1 | 11/2013 |
| WO | WO 2015/068186 A1 | 5/2015 |

| Time elapsed | State of vehicle | User | Controller | Current breaker | Positive power supply line | Cranking |
|---|---|---|---|---|---|---|
| T0 | Start parking | — | — | Not operate | Close | Possible |
| T1 | → | — | — | → | → | → |
| T2 | → | — | Detect parking, execute current cutoff | Operate | Open | Not possible |
| T3 | → | — | — | → | → | → |
| T4 | → | — | — | → | → | → |
| T5 | Before driving | Pre-motion prior to start of driving | — | → | → | → |
| T6 | → | — | Detect pre-motion, release current cutoff | Release operation | Close | Possible |
| T7 | → | — | — | → | → | → |
| T8 | → | — | — | → | → | → |

Fig. 10 understand# BATTERY APPARATUS, VEHICLE, AND AUTOMATIC VEHICLE

CROSS REFERENCE TO RELATED APPLICATIONS

This application is a national stage application, filed under 35 U.S.C. § 371, of International Application No. PCT/JP2017/003254, filed Jan. 31, 2017, which international application claims priority to Japanese Application No. 2016-017733, filed Feb. 2, 2016, the contents of both of which as are hereby incorporated by reference in their entirety.

BACKGROUND

Technical Field

The present invention relates to control of a current breaker for cutting off a current of a battery.

Description of Related Art

JP-U-62-74455 discloses that, when an output of a discharged magnitude detector exceeds a set value while an engine is stopped, a battery relay is turned off, and a whole electric load is disconnected from a battery so as to prevent the battery from going flat.

BRIEF SUMMARY

When a current breaker for an engine-starting battery is operated while the engine is stopped, the supply of power from the battery to the vehicle is stopped. Hence an engine starter such as a starter motor cannot be turned on, leading to a state where the vehicle cannot be cranked. It is thus necessary to release the operation of the current breaker before driving. Releasing the operation of the current breaker has hitherto required operating a release switch incorporated in the battery and charging the battery. When operating the release switch and charging the battery as thus described, the first necessary step is that a user himself or herself accesses the in-vehicle battery by, for example, opening a hood or the like, which has been troublesome.

The present invention has been accomplished based on such circumstances as above, and it is an object of the present invention to reduce the trouble of releasing a current breaker while preventing a decrease in capacity during parking.

Disclosed in this specification is a battery apparatus to be installed in a vehicle, including: an energy storage device which supplies power to a load including an engine starter; a current breaker which cuts off a current from the energy storage device to the load; and a controller, wherein the controller when detecting a parking state of the vehicle, performs a current cutoff processing which cuts off the current from the energy storage device to the load by causing the current breaker to operate; and after performing the current cutoff processing and when detecting a pre-motion, which a user performs for the vehicle before starting driving, releases the current cutoff by releasing the operation of the current breaker.

According to the battery apparatus disclosed in the present specification, it is possible to reduce the trouble of releasing the current breaker while preventing the decrease in capacity during parking.

DETAILED DESCRIPTION OF VARIOUS EMBODIMENTS

Outline of Embodiment

First, the outline of a battery apparatus to be installed in a vehicle, disclosed in a present embodiment will be explained. A battery apparatus includes: an energy storage device which supplies power to a load including an engine starter; a current breaker which cuts off a current from the energy storage device to the load; and a controller, wherein the controller when detecting a parking state of the vehicle, performs a current cutoff processing which cuts off the current from the energy storage device to the load by causing the current breaker to operate; and after performing the current cutoff processing and when detecting a pre-motion, which a user performs for the vehicle before starting driving, releases the current cutoff by releasing the operation of the current breaker.

In the present configuration, when a controller detects a parking state of a vehicle, the controller cuts off a current from an energy storage device to a load by causing a current breaker to operate. Hence it is possible to prevent a decrease in capacity of the energy storage device during parking and to prevent that the parked vehicle cannot be cranked when being driven. Further, the controller detects a pre-motion prior to the start of driving, and automatically releases the operation of the current breaker. It is thus possible to reduce the trouble of releasing the current breaker.

As an embodiment of the battery apparatus disclosed in the present embodiment, the following configuration is preferable.

The battery apparatus includes a displacement detector which detects a displacement of the battery apparatus, and when a displacement of the battery apparatus is detected while the vehicle is parked, the controller determines that the pre-motion has been executed. In the present configuration, it is possible to detect the pre-motion prior to the start of driving, such as a user opening and closing the door or getting into the seat, accompanied by vibration of a vehicle body.

The controller determines the execution of the pre-motion based on an output of an external switch which operates in response to the pre-motion. In the present configuration, the pre-motion prior to the start of driving is detected based on the output of the external switch, so that the configuration of the battery apparatus can be simplified.

The external switch is a mechanical switch which is disposed on the vehicle. The mechanical switch is resistant to vibration from the vehicle and has fewer failures compared to a semiconductor type switch. In addition, a malfunction hardly occurs.

The battery apparatus includes a current detector which detects a current of the energy storage device, and the controller determines that the vehicle is in the parking state if a state where a current of a predetermined value or more does not flow continues for a predetermined period. In the present configuration, the parking state can be detected by using the output of the current detector.

The battery apparatus includes a displacement detector which detects a displacement of the battery apparatus, and the controller determines that the vehicle is in the parking state if a state where the battery apparatus is not displaced continues for a predetermined period.

When the controller detects that the vehicle is in the parking state and a capacity of the energy storage device reaches a predetermined value, the controller performs the current cutoff processing to cut off the current from the energy storage device to the load by causing the current breaker to operate. In the present configuration, even after the parking state of the vehicle is detected, the energy storage device can be used until the capacity of the energy storage device reaches the predetermined value. This lengthens a period in which the battery apparatus is usable.

After execution of the current breaker, the controller releases the current cutoff if the pre-motion is detected and the battery apparatus is normal, and the controller does not release the current cutoff if the battery apparatus is abnormal even through the pre-motion is detected. In the present configuration, if the energy storage device is abnormal, it is possible to prevent the battery apparatus from being used.

In addition to the case where the parking state of the vehicle is detected, also in a case where an abnormality of the battery apparatus is detected, the controller performs the current cutoff processing to cut off the current from the energy storage device to the load by causing the current breaker to operate. In the present configuration, if the battery apparatus is abnormal, it is possible to prevent the battery apparatus from being used.

After the controller releases the operation of the current breaker in response to the detection of the pre-motion, the controller causes the current breaker to operate again to cutoff the current from the energy storage device to the load if the vehicle does not transition from the parking state to a driving state within a predetermined period. In the present configuration, even when the pre-motion prior to the start of driving is detected, if the vehicle does not drive afterwards, the current is cut off, so that it is possible to further prevent the decrease in capacity of the energy storage device.

In a case where the battery apparatus is arranged in the vehicle such that the battery apparatus is not exposed to outside, the user's accessibility to the battery apparatus is poor, and thus, when the current breaker is caused to operate and cut off the current to the load, it is very troublesome to release the current cutoff. By applying the present invention to the battery apparatus which is arranged in the vehicle such that the battery apparatus is not exposed to outside, it is possible to greatly reduce the trouble of releasing the current breaker.

"Being arranged in the vehicle such that the battery apparatus is not exposed to outside" means that the battery apparatus cannot be seen from the outside of the vehicle or that the battery apparatus cannot be seen from the user in a vehicle cabin. As an arrangement example corresponding to this, in the case of a four-wheeled vehicle, a case can be exemplified where the battery apparatus is arranged in a closed accommodation space such as an engine room or a trunk room. Besides that, a case can be exemplified where the battery apparatus is accommodated in an accommodation unit provided on a floor as covered with a carpet, a cover or the like. The arrangement examples also include a case where the battery apparatus is arranged in the lower part of the seat in the state of being hidden by the seat.

Examples of the vehicle in which the battery apparatus is to be disposed include not only the four-wheeled vehicle but also a motorcycle. In the case of the motorcycle, "being arranged in the vehicle such that the battery apparatus is not exposed to outside" means that the battery apparatus is accommodated in the state of being stored in the seat, for example. Besides that, a case can be exemplified where the battery apparatus is attached to the vehicle body in the state of being surrounded with covers such as a front cover and a side cover.

The energy storage device is preferably a lithium-ion secondary battery. The lithium-ion secondary battery is provided with a monitor for monitoring the state (a current value, a voltage value, etc.) of the battery from characteristics of the battery. Thus, by utilizing the function of the monitor, it is possible to constitute a system that controls the current breaker without adding the current detector or the controller. This leads to addition of fewer hardware units and a smaller increase in cost.

The vehicle is preferably an automatic vehicle. The automatic vehicle can be cranked only by driving an engine starter such as a starter motor, and it is thus necessary to maintain the capacity of the battery in particular, so as not to bring the engine starter into an undrivable state. By applying the present technology, the capacity of the battery can be maintained, thus enabling prevention of the automatic vehicle from being undrivable due to the impossibility of cranking.

First Embodiment

A first embodiment will be described with reference to FIGS. 1 to 4.

1. Configuration of Battery Pack 20

Figure 1:
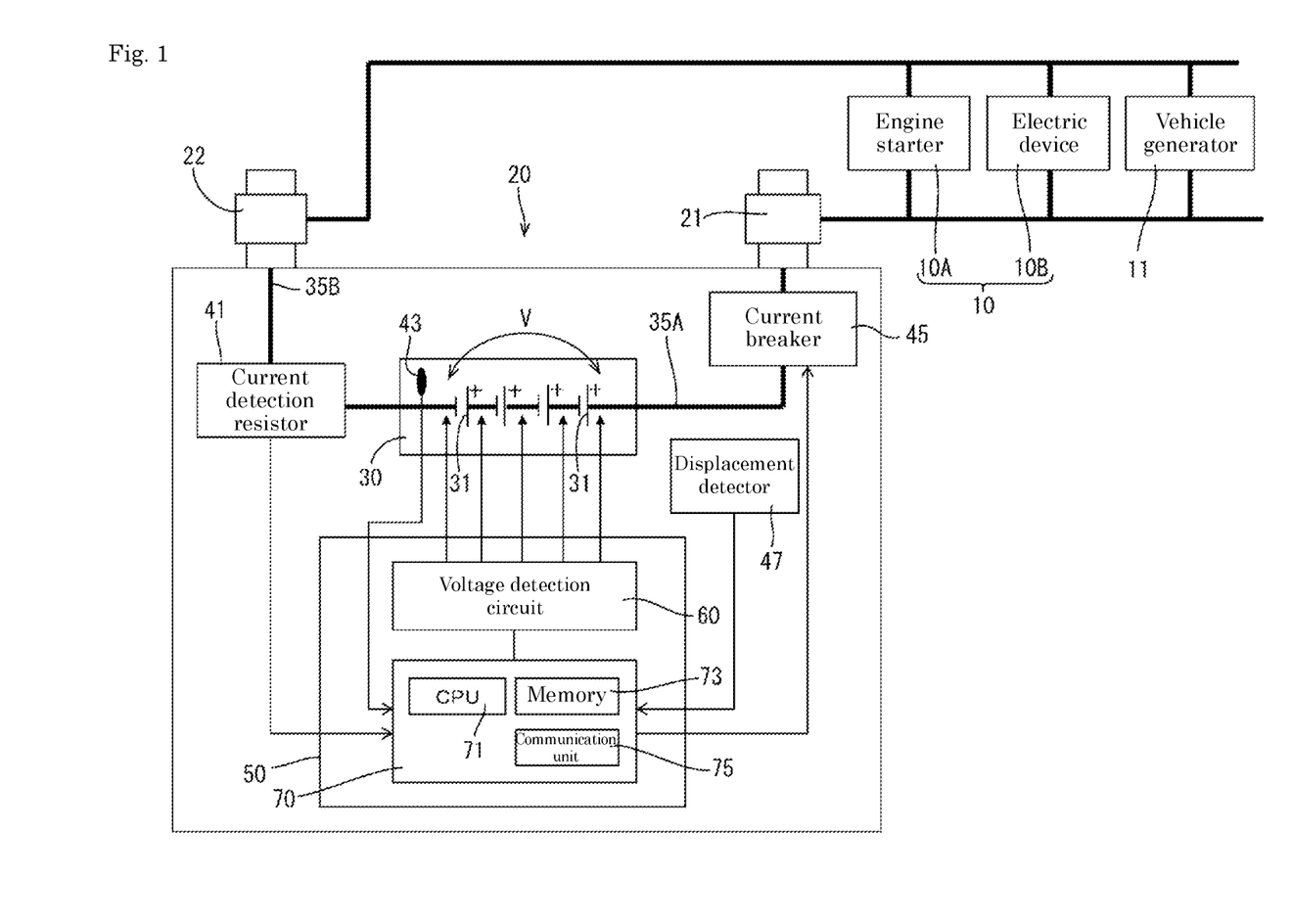
FIG. 1 is a block diagram showing an electric configuration of a battery pack applied to a first embodiment.

FIG. 1 is a block diagram showing an electric configuration of a battery pack 20 in the present embodiment. The battery pack 20 is mounted in the state of being accommodated in a closed accommodation space such as an engine room, or an accommodation unit provided on a floor as covered with a carpet, a cover or the like, in a four-wheeled vehicle (preferably an automatic vehicle equipped with an automatic transmission). The battery pack 20 functions as a power supply of an engine starter 10A. A load 10 of the battery pack 20 includes a plurality of electric devices 10B such as a headlight, a vehicle interior light, an audio set, a clock, a security device, and an in-vehicle electric control unit (ECU), other than the engine starter (specifically, a starter motor) 10A. The plurality of loads 10A, 10B are connected in parallel to the battery pack 20. A vehicle generator 11 is also connected in parallel, and the battery pack 20 supplies electric power to each load 10 including the engine starter 10A and is charged by the vehicle generator (alternator) 11. Reference sign 21 shown in FIG. 1 denotes a positive electrode terminal of the battery pack 20, and reference sign 22 denotes a negative electrode terminal.

As shown in FIG. 1, the battery pack 20 includes an assembled battery 30, a current detection resistor 41, a thermistor 43, a current breaker 45, a displacement detector 47, and a battery manager (hereinafter referred to as BM) 50 that manages the assembled battery 30. The assembled battery 30 is made up of a plurality of lithium-ion secondary batteries 31 connected in series. The battery pack 20 is an example of the "battery apparatus" of the present invention, and the current detection resistor 41 is an example of the "current detector." The lithium-ion secondary battery 31 is an example of the "energy storage device."

The assembled battery 30, the current detection resistor 41, and the current breaker 45 are connected in series via a power line 35. In the present example, the current detection resistor 41 is arranged on the negative electrode side and the current breaker 45 is arranged on the positive electrode side. The current detection resistor 41 is connected to a negative electrode terminal 22 and the current breaker 45 is connected to a positive electrode terminal 21.

The current detection resistor 41 functions to detect a current flowing through the assembled battery 30. The thermistor 43 is a contact type or a non-contact type and functions to measure the temperature [° C.] of the assembled battery 30. The current detection resistor 41 and the thermistor 43 are connected to the BM 50 through a signal line, and detection values of the current detection resistor 41 and the thermistor 43 are taken into the BM 50.

The current breaker 45 is, for example, a semiconductor switch such as a field-effect transistor (FET) or a relay, and functions to open the positive-side power line 35 in response to a command (control signal) from the BM 50 to cut off the current of the assembled battery 30.

The displacement detector 47 is provided inside the battery pack 20 and functions to detect the displacement of the battery pack 20. Specifically, the displacement detector 47 detects whether or not the position of the battery pack 20 has been displaced and detects the level of the displacement. The displacement detector 47 can be made up of a vibration sensor, for example. In addition to the vibration sensor, the displacement detector 47 can be made up of an acceleration sensor or a position sensor. The displacement detector 47 is connected to the BM 50 through a signal line, and a detection value of the displacement detector 47 is taken into the BM 50.

The BM 50 is provided inside the battery pack 20 and includes a voltage detection circuit 60 and a controller 70. The voltage detection circuit 60 is connected to both ends of each of the secondary batteries 31 via detection lines, and functions to measure a voltage of each secondary battery 31 and a total voltage V of the assembled battery 30 in response to an instruction from the controller 70.

The controller 70 includes a central processing unit (hereinafter referred to as CPU) 71, a memory 73, and a communication unit 75. The controller 70 functions to monitor the state of the assembled battery 30 and control the current breaker 45 based on information on a current, a voltage, and a temperature detected by the current detection resistor 41, the voltage detection circuit 60, and the thermistor 43. The memory 73 stores a monitoring program for monitoring the assembled battery 30, programs for executing current cutoff execution control and current cutoff release control which will be described later, and data necessary for executing these programs. The communication unit 75 functions to communicate with an external device such as a vehicle electronic control unit (ECU).

2. Current Cutoff Control by Controller 70 and Automatic Release Thereof

Figure 2:
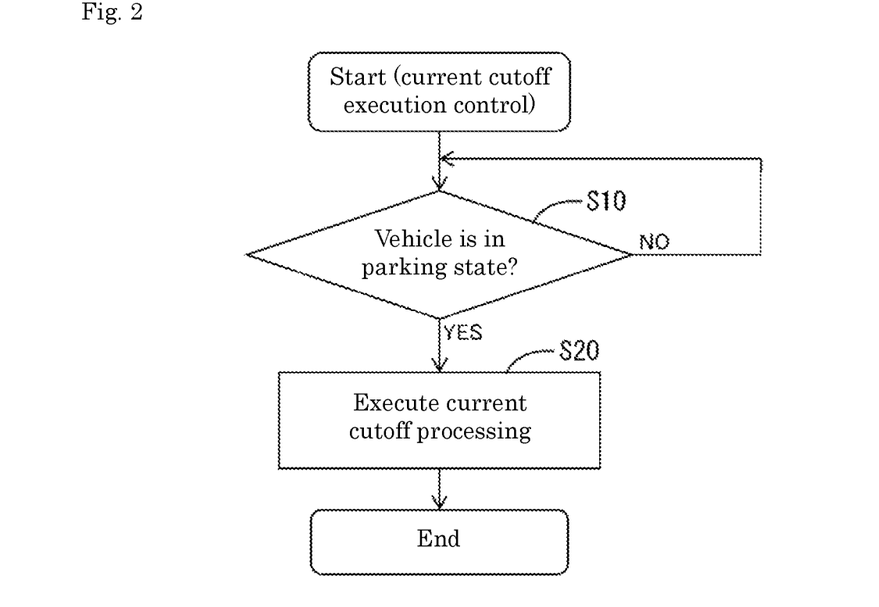
FIG. 2 is a flowchart showing a flow of processing of current cutoff execution control.
Figure 3:
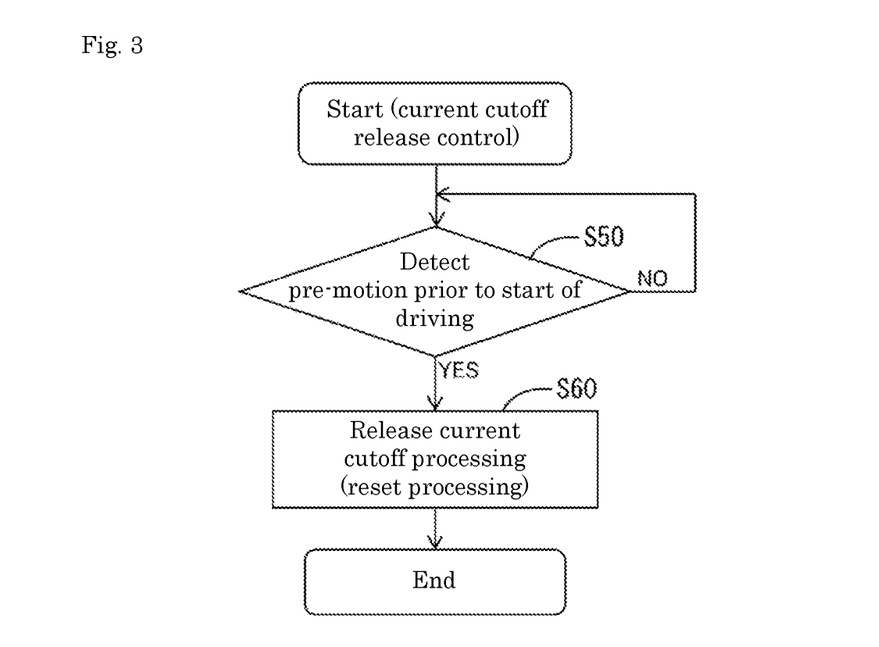
FIG. 3 is a flowchart showing a flow of processing of the current cutoff release control.
Figure 4:
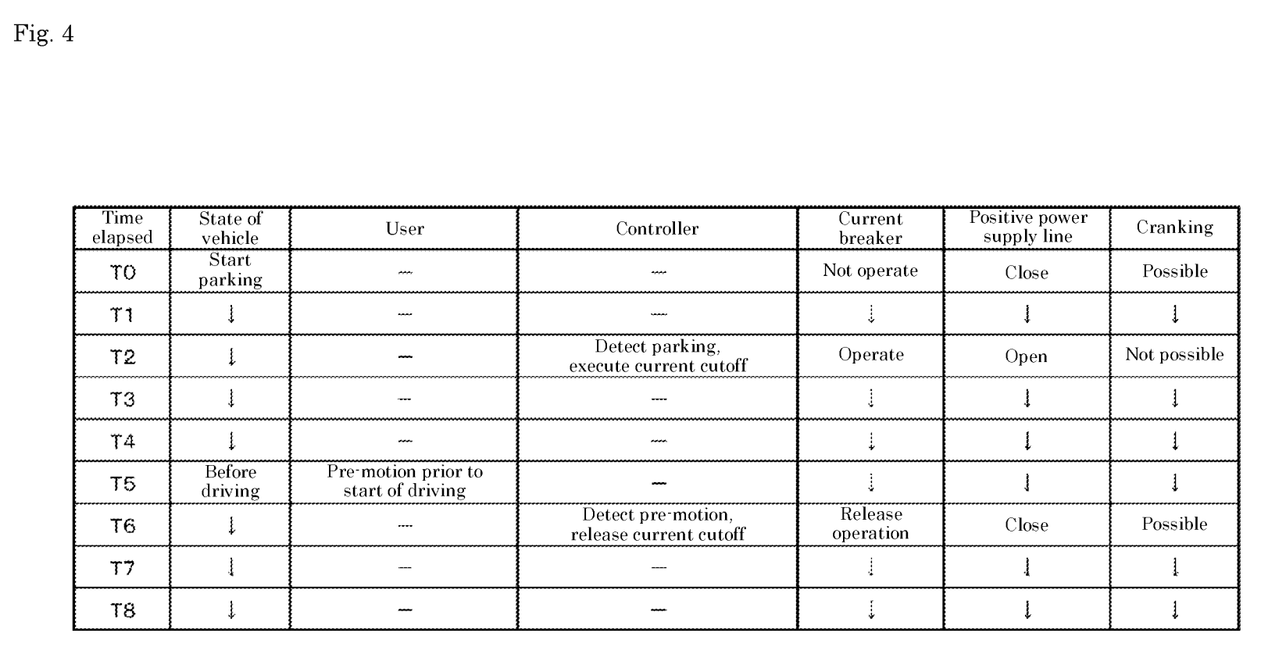
FIG. 4 is a table summarizing transition of an operation state of a current breaker and a connection state of a power supply line after parking.

FIG. 2 is a flowchart showing the flow of processing of the current cutoff execution control, and FIG. 3 is a flowchart showing the flow of processing of the current cutoff release control. FIG. 4 is a table summarizing the transition of the operation state of the current breaker and the connection state of the power supply line after parking.

The assembled battery 30 needs to maintain a predetermined capacity in order to drive the engine starter 10A at any time. However, since the assembled battery 30 is not charged during parking, if the power is consumed and the capacity falls below the predetermined value during parking, there is a possibility that the vehicle cannot be cranked because the engine starter 10A cannot be driven. Therefore, in parallel with monitoring the state of the assembled battery 30, the controller 70 performs the current cutoff execution control shown in FIG. 2.

Specifically, the current cutoff execution control is composed of two steps S10 and S20. In parallel with monitoring the state of the assembled battery 30, the controller 70 executes the processing of determining whether or not the vehicle is in the parking state (S10). In the present example, whether or not the vehicle is in the parking state is determined from the current flowing through the assembled battery 30.

The controller 70 performs the processing of comparing the current detected by the current detection resistor 41 with a predetermined value Xa (as one example, 50 mA which is the maximum value of a "dark current"), and when a state where the detected current is equal to or less than the predetermined value Xa continues for a predetermined period (as one example, 12 hours), the controller 70 determines that the vehicle is in the parking state. The "dark current" is a current consumed by the clock, the audio set, the security device, the memory of the in-vehicle ECU, and the like even when all doors are closed and all switches are turned off with an ignition key disconnected.

When determining that the vehicle is in the parking state, the controller 70 executes the current cutoff processing. Specifically, a cutoff signal is output to the current breaker 45 to cause the current breaker 45 to operate (S20, time T2 in FIG. 4). As a result, the current breaker 45 comes into an open state, so that a positive-side power supply line 35A comes into an open state, and the assembled battery 30 is disconnected from the load 10 and the vehicle generator 11. It is possible to prevent the decrease in capacity of the assembled battery 30 during parking, and thereby to prevent a problem of being unable to execute cranking at the time of driving the parked vehicle.

After executing the current cutoff processing, the controller 70 performs the current cutoff release control shown in FIG. 3. The current cutoff release control is composed of two steps S50 and S60, and the controller 70 first performs the processing of detecting whether or not the "pre-motion" has been executed (S50). The "pre-motion" is, for example, a motion previously performed so as to drive the vehicle, such as the user opening the door of the vehicle or getting into the seat of the vehicle. In the present example, during parking of the vehicle, the controller 70 monitors the output of the displacement detector 47. When detecting the displacement of the position of the battery pack 20, the controller 70 determines that the "pre-motion" has been executed, and when detecting no displacement of the battery pack 20, the controller 70 determines that the "pre-motion" has not been executed.

When the user opens and closes the door of the parked vehicle, the vibration at that time is transmitted to the battery pack 20 via the body of the vehicle, and the position of the battery pack 20 is displaced. When the user gets into the seat of the parked vehicle, the position of the battery pack 20 is displaced because the vehicle body sinks with a suspension. By detecting the displacement of the position of the battery pack 20, it is possible to detect whether or not the "pre-motion" has been executed.

When detecting the execution of the "pre-motion", the controller 70 performs the processing (reset processing) of releasing the current cutoff. Specifically, the controller 70 outputs a cutoff release signal to the current breaker 45 to release the operation of the current breaker 45 (S60, time T6 in FIG. 4). As a result, the current breaker 45 comes into a closed state, so that the positive-side power supply line 35A comes into a closed state, and the assembled battery 30 is electrically connected to the load 10 and the vehicle generator 11. When the user inserts and turns the ignition key, the engine starter 10A is driven using the assembled battery 30 as a power supply, and the vehicle is cranked. This makes the parked vehicle drivable.

3. Description of Effects

In the present configuration, when the controller 70 detects the parking state of the vehicle, the controller 70 cuts off the current from the assembled battery 30 to the load by causing the current breaker 45 to operate. Hence it is possible to prevent the decrease in capacity of the assembled battery 30 during parking and to prevent the state that the parked vehicle cannot be cranked. Further, when the user's pre-motion is detected, the controller 70 releases the operation of the current breaker 45 and automatically releases the cutoff of the current. Therefore, it is possible to reduce the trouble of releasing operation of the current breaker 45.

In the present configuration, the assembled battery 30 is the lithium-ion secondary battery 31. The lithium-ion secondary battery 31 includes a monitor for monitoring the state (current value, voltage value, etc.) of the battery from the characteristics of the battery. By utilizing the function of the monitor, it becomes possible to configure a system that controls the current breaker 45 without adding the current detector 41 and the controller 70. This leads to addition of fewer hardware units and a smaller increase in cost.

The automatic vehicle can be cranked only by driving the engine starter 10A, and it is thus necessary to maintain the capacity of the assembled battery 30 in particular, so as not to bring the engine starter 10A into an undrivable state. By applying the present technology, the capacity of the assembled battery 30 can be maintained, thus enabling prevention of the automatic vehicle from being undrivable due to the impossibility of cranking.

Second Embodiment

In the first embodiment, the parking state of the vehicle has been determined from the current value of the assembled battery 30. In a second embodiment, the determination method for the parking state is different from that in the first embodiment. Specifically, the controller 70 detects the displacement of the battery pack 20 from the output of the displacement detector 47, and if a state where there is no displacement continues for a predetermined period (as one example, 12 hours), the controller 70 determines that the vehicle is in the parking state.

The reason why it is possible to determine that the vehicle is in the parking state if the state where the battery pack 20 is not displaced continues for the predetermined period is as follows: During driving, vibration is applied to the vehicle body due to unevenness of the road surface or acceleration and deceleration. Even when the vehicle is stopped, the state is transitioned to the driving state in course of time, whereby vibration is applied to the vehicle body within the predetermined period. That the state in which the displacement of the battery pack 20 is not detected continues for the predetermined period means that no vibration has been applied to the vehicle body during that time, and it can be determined that the vehicle is in neither the driving state or stopping state, namely in the parking state.

When determining that the vehicle is in the parking state, the controller 70 outputs a cutoff signal to the current breaker 45 to cause the current breaker 45 to operate (S20 in FIG. 2). As a result, the current breaker 45 comes into an open state, so that a positive-side power supply line comes into the open state, and the assembled battery 30 is disconnected from the load of the vehicle. Therefore, it is possible to prevent the decrease in capacity of the assembled battery 30 during parking. It is possible to prevent a problem that cranking cannot be executed at the time of driving the parked vehicle as in the first embodiment.

Third Embodiment

Figure 5:
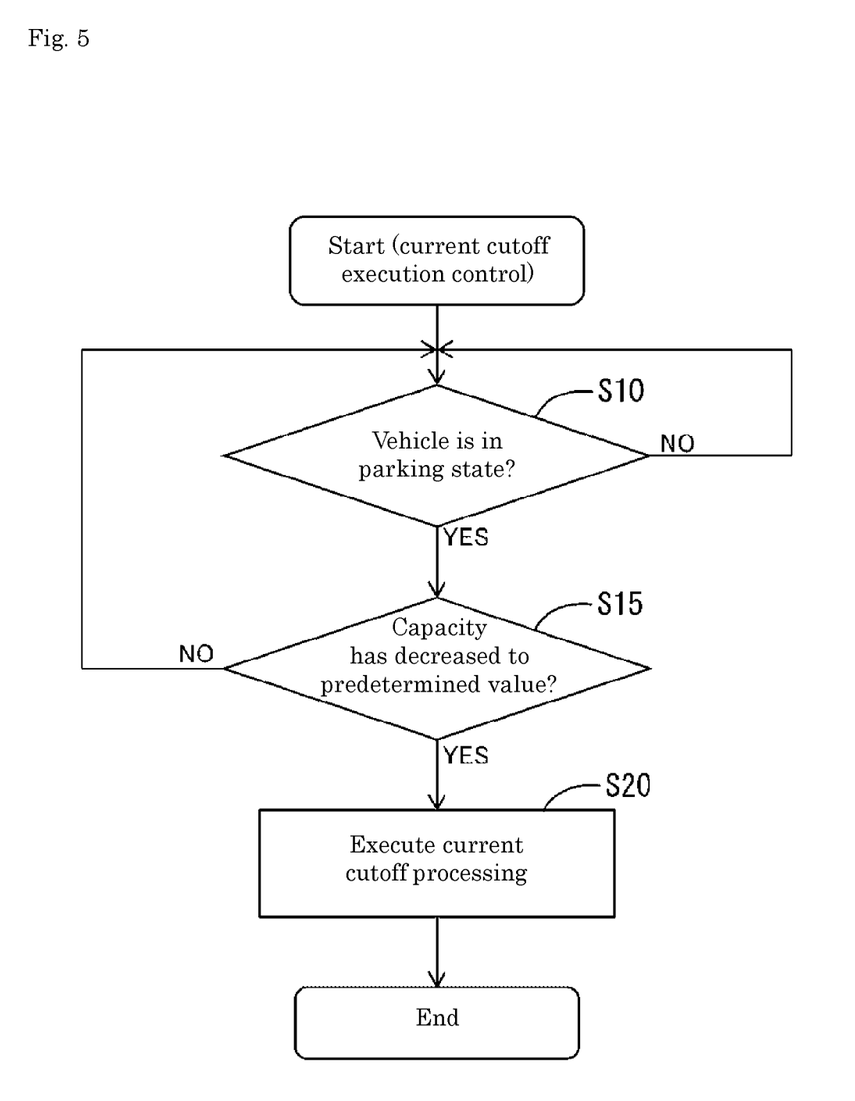
FIG. 5 is a flowchart showing a flow of processing of the current cutoff release control applied to a third embodiment.

A third embodiment will be described with reference to FIG. 5. FIG. 5 is a flowchart showing the flow of processing of the current cutoff execution control applied to the third embodiment. In the first embodiment, the current cutoff execution control has been composed of the two steps S10 and S20, and in the third embodiment, a step S15 is added, and the condition for executing the current cutoff processing is different from that of the first embodiment.

Specifically, in the processing of S15, the processing of comparing the capacity of the assembled battery 30 with a predetermined value (a capacity preferably maintained at least, to execute cranking) is performed. When the vehicle is in the parking state (YES in S10) and the capacity of the assembled battery 30 is the predetermined value (YES in S15), the current cutoff processing is executed. In the present configuration, even when the vehicle is determined to be in the parking state, the current cutoff processing is not executed during a period when the capacity of the assembled battery 30 is equal to or more than the predetermined value (NO in S15). Therefore, there is an advantage of lengthening a period in which the assembled battery 30 is usable. The capacity (residual capacity) of the assembled battery 30 can be calculated from an initial value of the capacity and an integrated value of the charge-discharge current.

Fourth Embodiment

Figure 6:
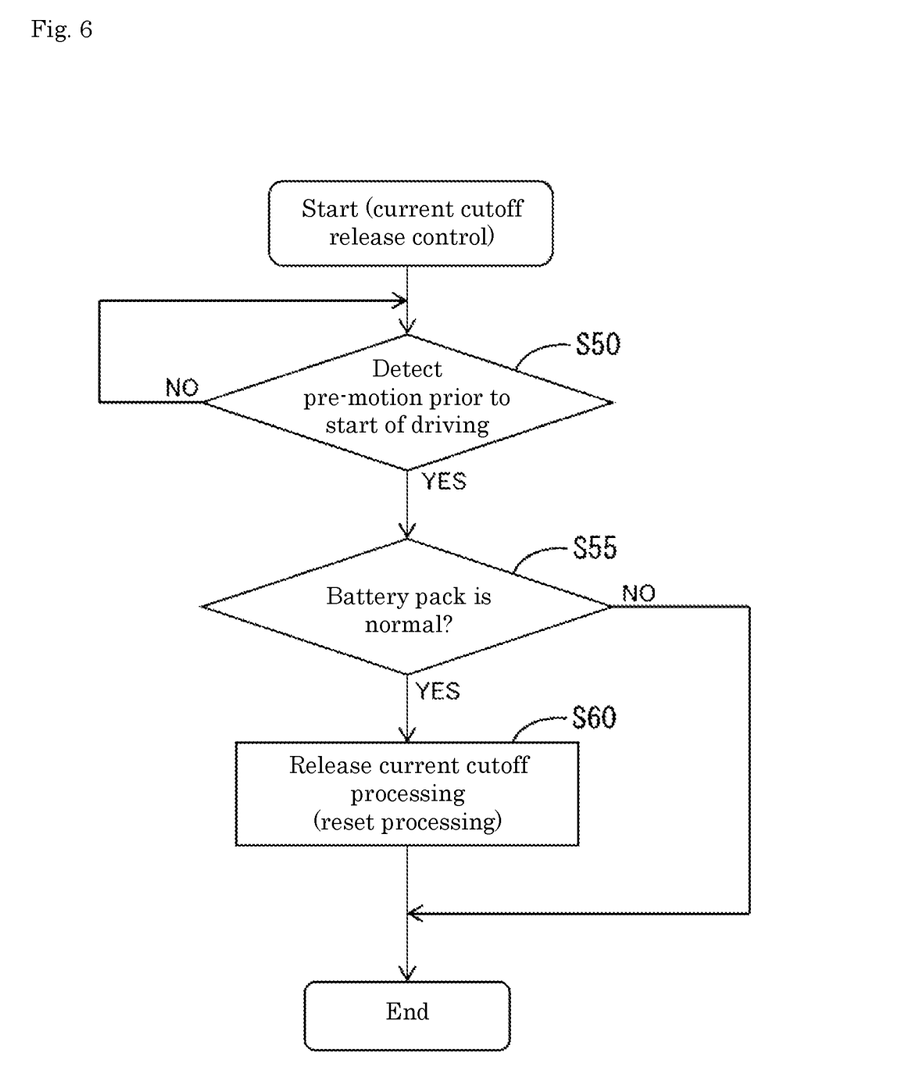
FIG. 6 is a flowchart showing a flow of processing of the current cutoff release control applied to a fourth embodiment.

A fourth embodiment will be described with reference to FIG. 6. FIG. 6 is a flowchart showing the flow of processing of the current cutoff release control applied to the fourth embodiment. In the first embodiment, the current cutoff release control has been composed of the two steps S50 and S60, and in the fourth embodiment, a step S55 is added, and the condition for releasing the current cutoff processing is different from that of the first embodiment.

Specifically, when executing the current cutoff processing of S20 as in the first embodiment, the controller 70 then starts the current cutoff release control shown in FIG. 6. First, the processing of detecting whether or not the "pre-motion" has been executed is performed (S50). When detecting the "pre-motion", the controller 70 then executes the processing of determining whether or not the assembled battery 30 is "normal" (S55). In the present example, the determination of whether or not the battery pack 20 is normal is made under the following two conditions:

(1) Have the current data, the voltage data, and the temperature data of the assembled battery 30 been measured normally?

(2) Are the current data, the voltage data, and the temperature data of the assembled battery 30 within the use ranges?

When all of the current data, the voltage data, and the temperature data of the assembled battery 30 have been measured normally and are within the use ranges, the controller 70 determines that the battery pack 20 is "normal."

If there is some abnormality in the measurement (sensor failure, disconnection, etc.), such as failure to measure the current data, the voltage data, or the temperature data, or even when the measurement is normal, if one measurement value is out of the use range, the controller 70 determines that the battery cell 20 is abnormal. The current data, the voltage data, and the temperature data can be detected from a voltage of the current detection resistor 41, and outputs of the voltage detection circuit 60 and the thermistor 43.

When determining that the battery pack 20 is "normal" (YES in S55), the controller 70 performs the processing (reset processing) of releasing the current cutoff. Specifically, a cutoff release signal is output to the current breaker 45 to release the operation of the current breaker 45 (S60). As a result, the current breaker 45 comes into the closed state, so that the cutoff state of the current is released, and the assembled battery 30 is electrically connected to the load 10 and the vehicle generator 11.

When determining that the battery pack 20 is "abnormal" (NO in S55), the controller 70 does not execute the processing of releasing the current cutoff but holds the cutoff state of the current. Hence the assembled battery 30 is held in the state of being separated from the load 10 and the vehicle generator 11. In the present configuration, even when the execution of the pre-motion is detected, if the abnormality of the assembled battery 30 is detected, the current cutoff is not released. This makes it possible to prevent the use of the abnormal battery pack 20.

Fifth Embodiment

Figure 7:
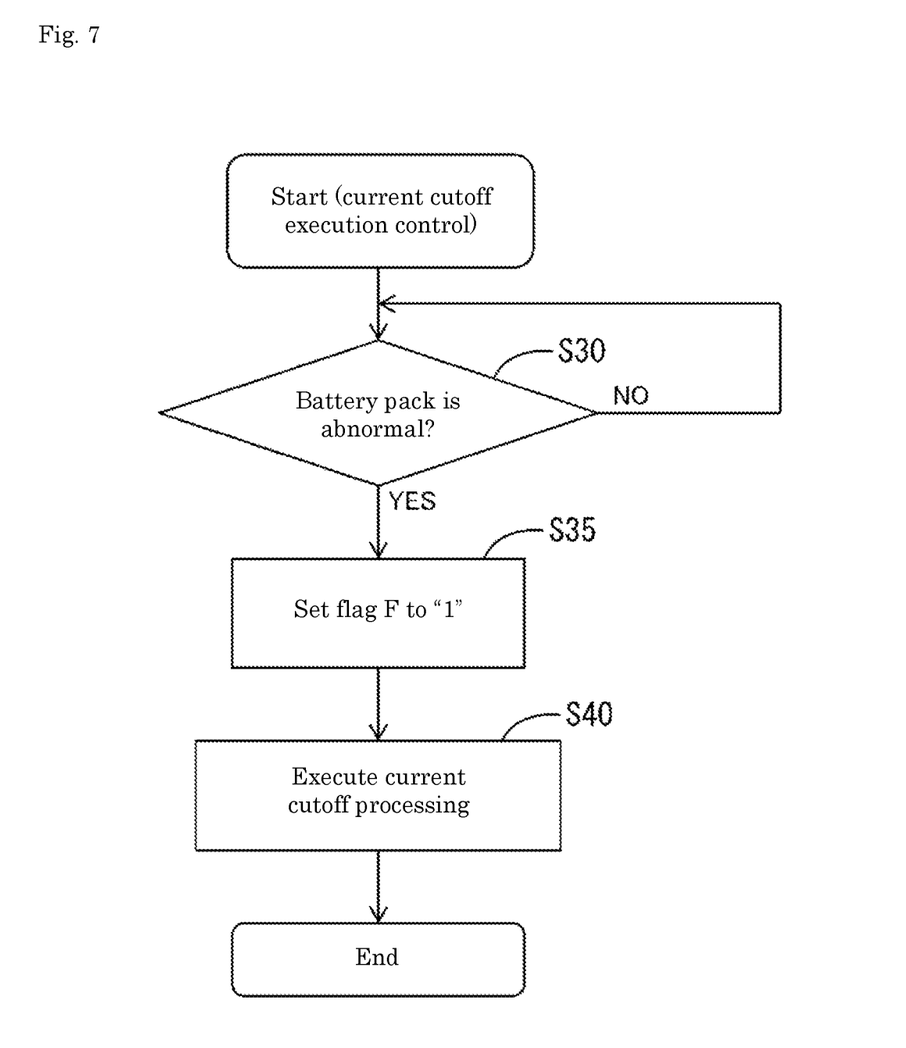
FIG. 7 is a flowchart showing a flow of processing of the current cutoff execution control applied to a fifth embodiment.
Figure 8:
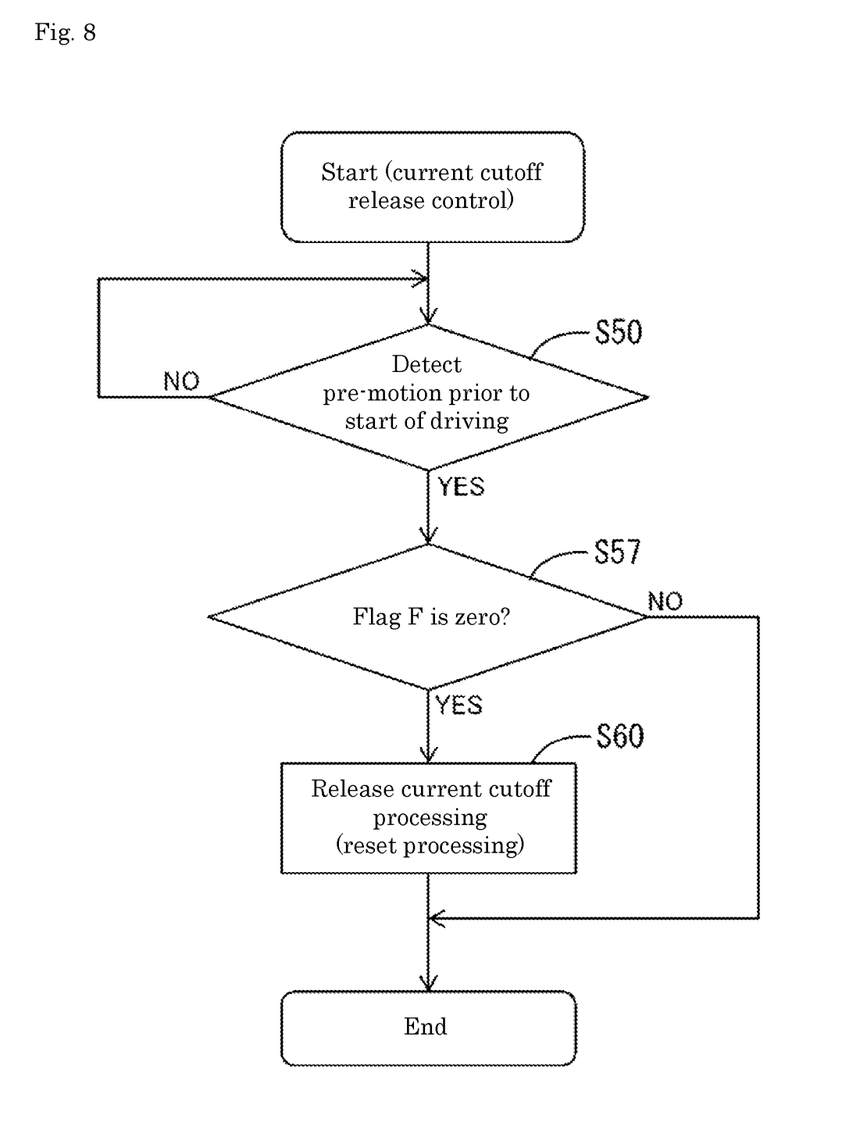
FIG. 8 is a flowchart showing a flow of processing of the current cutoff release control applied to the fifth embodiment.

A fifth embodiment will be described with reference to FIGS. 7 and 8. FIG. 7 is a flowchart showing the flow of processing of the current cutoff execution control applied to the fifth embodiment, and FIG. 8 is a flowchart showing the flow of processing of the current cutoff release control applied to the fifth embodiment.

In the first embodiment, in the case where the parking state of the vehicle is detected, the current from the assembled battery 30 to the load 10 has been cut off by causing the current breaker 45 to operate. In the fifth embodiment, if the abnormality of the assembled battery 30 is detected, the current is cut off by causing the current breaker 45 to operate.

Specifically, the current cutoff control (FIG. 7) applied to the fifth embodiment is composed of three steps S30, S35, and S40. Then, while monitoring the state of the assembled battery 30, the controller 70 monitors the current, the voltage, and the temperature of the assembled battery 30, and performs the processing of determining whether or not the assembled battery 30 is abnormal (S30). In the present example, if all of the current data, the voltage data, and the temperature data are normal values, the assembled battery 30 is determined to be "normal", and if there is even one abnormal value, the assembled battery 30 is determined to be abnormal.

When determining that the assembled battery 30 is abnormal (YES in S30), the controller 70 first accesses the memory 73 and performs the processing of rewriting a flag F from "0" to "1" (S35). An initial value of the flag F is "0", and only when the assembled battery 30 is determined to be abnormal, the initial value of the flag F is rewritten to "1."

Following the rewriting of the flag F, the controller 70 executes the current cutoff processing (S40). The current cutoff processing is the same processing (S20) as in the first embodiment, and the controller 70 outputs a cutoff signal to the current breaker 45 to cause the current breaker 45 to operate. As a result, the current breaker 45 comes into the open state, so that the positive-side power supply line comes into the open state, and the assembled battery 30 is disconnected from the load 10 and the vehicle generator 11.

In this manner, if the assembled battery 30 is abnormal, the assembled battery 30 is disconnected from the vehicle, so that it is possible to prevent the use of the assembled battery 30 in the abnormal state. This enables protection of the assembled battery 30.

In the fifth embodiment, not only the current cutoff execution control shown in FIG. 7 is performed, but also the current cutoff execution control shown in FIG. 2 is performed in parallel. Therefore, when the parking state of the vehicle is detected, the current cutoff processing (S20) is executed as in the first embodiment.

When executing the current cutoff processing (S20, S40) by "detecting the parking of the vehicle" or "detecting the abnormality of the assembled battery 30", the controller 70 then executes the current cutoff release control shown in FIG. 8. The current cutoff release control shown in FIG. 8 is composed of three steps S50, S57, and S60, and the controller 70 first performs the processing of detecting whether or not the "pre-motion" has been executed (S50).

When detecting the execution of the "pre-motion", the controller 70 then performs the processing of determining whether or not the flag F is "zero" (S57). When the flag F is "zero" (i.e., when the current cutoff processing is executed by detecting the parking state), the controller 70 performs a processing (reset processing) for releasing the current cutoff. Specifically, a cutoff release signal is output to the current breaker 45 to release the operation of the current breaker 45 (S60). As a result, since the current breaker 45 is in a closed state, the power supply line on the positive electrode side is in a closed state, and the assembled battery 30 is electrically connected to the load of the vehicle.

If the flag F is "zero" (i.e., when the abnormality of the assembled battery 30 is detected and the current cutoff processing is executed), even when the controller 70 detects execution of the pre-motion, the controller 70 does not executes the processing of releasing the current cutoff and holds the cutoff state of the current. This makes it possible to prevent the use of the abnormal assembled battery 30.

Sixth Embodiment

Figure 9:
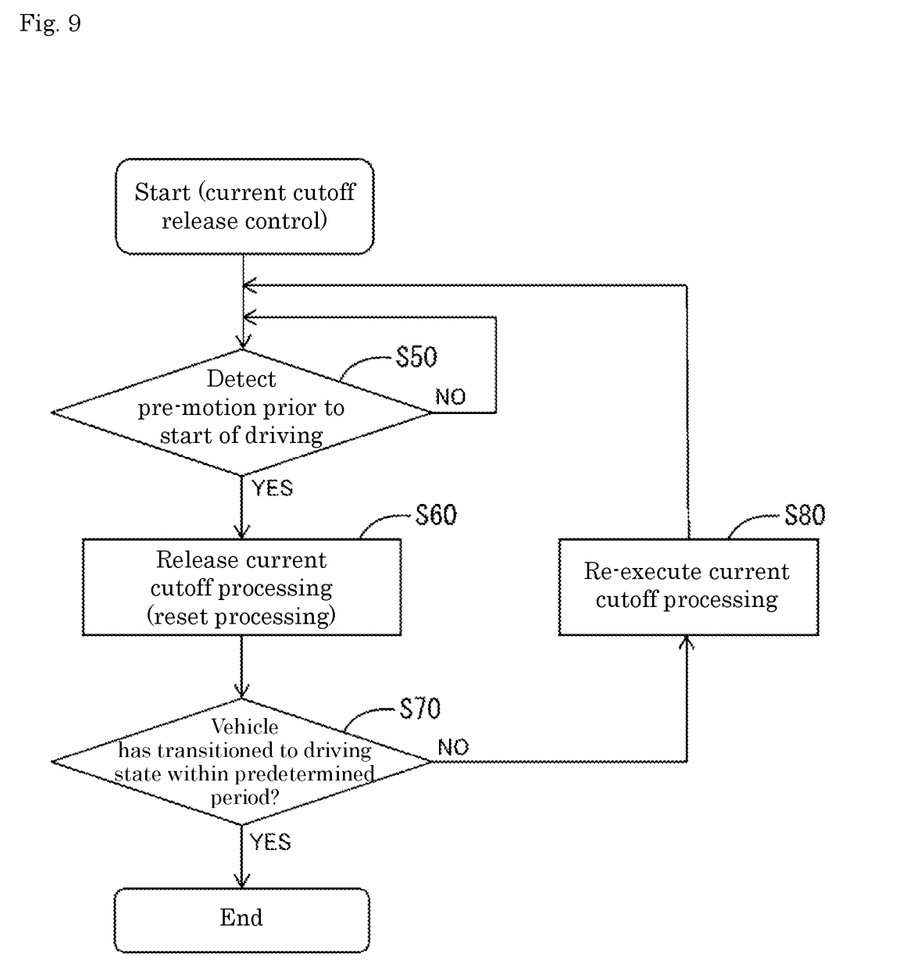
FIG. 9 is a flowchart showing a flow of processing of the current cutoff release control applied to a sixth embodiment.

A sixth embodiment will be described with reference to FIG. 9. FIG. 9 is a flowchart showing the flow of processing of the current cutoff release control applied to the sixth embodiment. In the first embodiment, the current cutoff release control has been composed of the two steps S50 and S60, and in the sixth embodiment, two steps S70 and S80 are added. The sixth embodiment is different from the first embodiment in that the current cutoff processing is re-executed if the vehicle does not transition to the driving state within a predetermined period after the current cutoff processing is released.

Specifically, when executing the current cutoff processing of S20 as in the first embodiment, the controller 70 then starts the current cutoff release control shown in FIG. 9. First, the controller 70 detects whether or not the "pre-motion" has been executed (S50).

When detecting the execution of the "pre-motion", the controller 70 performs the processing (reset processing) for releasing the current cutoff. Specifically, a cutoff release signal is output to the current breaker 45 to release the operation of the current breaker 45 (S60). As a result, the current breaker 45 comes into the closed state, so that the cutoff state of the current is released, and the assembled battery 30 is electrically connected to the load 10 and the vehicle generator 11.

Next, the controller 70 performs the processing of determining whether or not the vehicle has transitioned to the driving state within the predetermined period (e.g., within 30 minutes) after releasing the current cutoff (S70). In the present example, when the current value of the assembled battery 30 reaches or exceeds a predetermined value Xb (an operating current of the engine starter 10A, and as one example, 100 A) within the predetermined period, the vehicle is determined to have come into the driving state, and when the current value does not exceed the predetermined value Xb, the vehicle is determined not to have transitioned to the driving state.

When determining that the vehicle has not transitioned to the driving state (NO in S70), the controller 70 re-executes the current cutoff processing (S80). Specifically, a cutoff signal is output to the current breaker 45 to activate the current breaker 45. As a result, the current breaker 45 is in the open state, so that the power supply line on the positive electrode side is in an open state, and the assembled battery 30 is disconnected from the load 10 and the vehicle generator 11.

Even if the "pre-motion" is thus detected, if the vehicle does not transition to the driving state, it is possible to further prevent the reduction in the capacity of the assembled battery 30 by disconnecting the assembled battery 30 from the load 10.

Even when the current cutoff processing is re-executed, if the user re-executes the pre-motion prior to driving on the parked vehicle afterwards, the controller 70 performs the processing of releasing the current cutoff processing (S60), and the assembled battery 30 thereby comes into the state of being connected to the vehicle, which makes the vehicle drivable.

Seventh Embodiment

Figure 10:
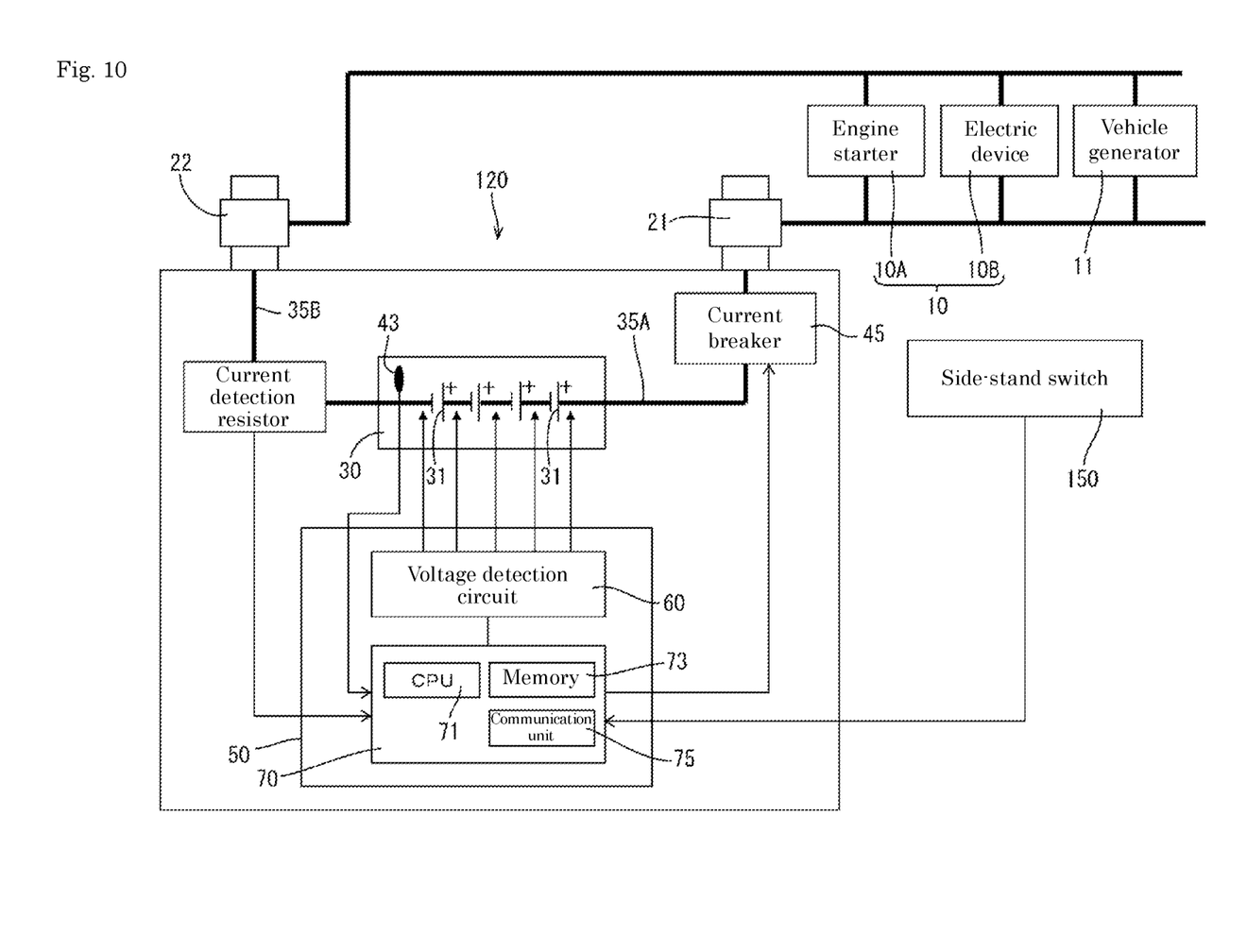
FIG. 10 is a block diagram showing an electric configuration of a battery pack applied to a seventh embodiment.

A seventh embodiment will be described with reference to FIG. 10. FIG. 10 is a block diagram showing an electric configuration of a battery pack 120 applied to the seventh embodiment. In the first embodiment, the battery pack 20 has been mounted in the four-wheeled vehicle, and in the seventh embodiment, the battery pack 120 is mounted in the motorcycle. The battery pack 120 is arranged in the state of being stored in the seat of the motorcycle and has a structure not exposed from the outside. The first embodiment has exemplified the method of determining whether or not the "pre-motion" has been executed based on the output of the displacement detector 47. However, in the seventh embodiment, the determination is made based on the state of a side-stand switch 150 disposed on the motorcycle.

Specifically, the side-stand switch 150 is a switch that is attached to a side-stand (not shown) for supporting the body of the motorcycle in a self-standing state and detects the state of the side-stand. The side-stand switch 150 is a mechanical switch having a mechanical contact. For example, when the side-stand is in the raised state (the state of supporting the motorcycle body so as to stand by itself), the contact is opened to come into an off-state, and when the side-stand is in the state of being flipped up and stored, the contact is closed to come into the on-state. The side-stand switch 150 and the BM 50 are connected through a signal line, and the controller 70 is configured to be able to detect the state (on-state, off-state) of the side-stand switch 150 from a change in voltage due to the opening and closing of the contact, for example. The side-stand switch 150 is an example of the "external switch" of the present invention.

In the seventh embodiment, the side-stand switch 150 is switched from the "off-state" to the "on-state" when a user performs the pre-motion of flipping up and storing the raised side-stand to the parked motorcycle. Therefore, by detecting the switching of the side-stand switch 150 from the "off-state" to the "on-state", the controller 70 can determine that the "pre-motion" has been executed.

The side-stand switch 150 is equipped as standard on a motorcycle for the purpose of preventing the engine from being turned on while the side-stand is raised. Although the side switch 150 is connected through a wire to an electric system such as a starting system of the motorcycle, in FIG. 10, only a wire (signal line) to the controller 70 of the battery pack 20 is shown, and the wire to the electric system of the motorcycle is omitted. In the seventh embodiment, the "pre-motion" prior to driving is detected based on the output of the side-stand switch 150 equipped as standard as thus described. Thus, the displacement detector 47 can be eliminated, and there is an advantage of being able to reduce the number of parts of the battery pack 120 as compared to the configuration of the first embodiment.

OTHER EMBODIMENTS

The present invention is not limited to the embodiments explained by the above description and drawings, and for example, the following embodiments are also included in the technical scope of the present invention.

(1) In the first embodiment, the four-wheeled vehicle has been exemplified as an example of the "vehicle" mounted with the battery pack 20. However, an application target of the present technology is not particularly limited so long as being the vehicle with an engine. For example, the motorcycle may be the application target as in the seventh embodiment, and a tricycle may be the application target. Although the present technology can be applied to either a manual vehicle that switches a transmission with a clutch or an automatic vehicle that has an automatic transmission, the present technology is preferably applied to the automatic vehicle. This is because, when the engine starter stops driving, the manual vehicle can be cranked by so-called pushing, whereas the automatic vehicle cannot be cranked unless the engine starter is driven.

(2) In the first embodiment, the lithium-ion secondary battery 31 has been exemplified as an example of the energy storage device. However, the type of the battery is not limited to the lithium-ion secondary battery and may, for example, be another secondary battery such as a lead-acid battery. The type of the battery may be an electrochemical cell such as a capacitor with an electrochemical phenomenon. In the first embodiment, the example has been shown where the current breaker 45 is provided on the positive-side power supply line 35A. However, the current breaker 45 may be disposed anywhere as long as being on a power supply line to the load and may, for example, be provided on a negative-side power supply line 35B.

(3) In the first embodiment, whether or not the vehicle is in the parking state has been detected by using the current value of the assembled battery 30. In the second embodiment, the detection is performed by using the output of the displacement detector 47. The parking state may be detected by a method other than the above. For example, when a parking button (operated by the user) is set on the vehicle, the parking state may be detected based on whether the parking button is on or off.

(4) In the first embodiment, whether or not the vehicle is in the parking state has been determined by comparing the current of the assembled battery 30 with the predetermined value Xa. In the first embodiment, although the predetermined value Xa has been set to the maximum value of the "dark current", the predetermined value Xa may, for example, be set to a value obtained by adding a consumption current of the load which may be used even in the parking state, such as the vehicle interior light, to the maximum value of the "dark current."

(5) In the seventh embodiment, the example has been shown where the battery pack 120 is mounted in the motorcycle. Then, the example has been described where the execution of the "pre-motion" prior to driving is determined based on the output signal of the side-stand switch 150. In the case of the side-stand type, the motorcycle stands by itself with a slight inclination. For this reason, when riding the parked motorcycle, the user performs the pre-motion of raising the inclination of the motorcycle and flipping up the side-stand, and hence the angle of the motorcycle is displaced at that time. Therefore, the displacement of the angle of the battery pack mounted in the motorcycle is detected using an angle sensor (an example of the displacement detector), so that it is possible to determine whether or not the "pre-motion" prior to driving has been executed.

(6) In the seventh embodiment, the example has been shown where the battery pack 120 is mounted in the motorcycle. Then, the example has been described where the execution of the "pre-motion" prior to driving is determined based on the output signal of the side-stand switch 150. Besides this, for example, in the case of a center-stand type motorcycle, it may be determined based on the output signal of the center stand switch whether or not the "pre-motion" prior to driving is executed.

(7) Whether or not the "pre-motion" prior to driving has been executed may be determined based on the direction of a steering wheel. In order to prevent theft during parking, the motorcycle may have the function of locking the movement of the steering wheel at a position where the steering wheel is rotated to the left with respect to the traveling direction of the motorcycle body. In this case, it may be detected by a sensor that the lock of the steering wheel has been released, and based on the output signal of the sensor, the execution of the "pre-motion" prior to driving may be determined.

(8) Whether or not the "pre-motion" prior to driving has been executed may be determined based on the position of the key. The motorcycle is operated by inserting the key into a key cylinder and turning the key. As a position where this key is inserted into the key cylinder and turned, there may be a position (ROCK) for locking the steering wheel, a position (OFF) for bringing the engine into the stopping state, and a position (ON) for making the engine startable. In this case, it may be detected by a sensor that the position of the key has changed from the position (ROCK) for rocking the steering wheel, and based on the output signal of the sensor, the execution of the "pre-motion" prior to driving may be determined. Further, it may be detected by the sensor that the position of the key has changed from the position (OFF) for stopping the engine, and based on the output signal of the sensor, the execution of the "pre-motion" prior to driving may be determined. Moreover, it may be detected by the sensor that the position of the key has changed to the position (ON) for making the engine startable, and based on the output signal of the sensor, the execution of the "pre-motion" prior to driving may be determined.

DESCRIPTION OF REFERENCE SIGNS

20 . . . battery pack (example of "battery apparatus" of the present invention)
30 . . . assembled battery
31 . . . secondary battery (example of "energy storage device" of the present invention)
41 . . . current detection resistor (example of "current detector" of the present invention)
45 . . . current breaker
47 . . . displacement detector
50 . . . battery manager (example of "monitor" of the present invention)
60 . . . voltage detection circuit
70 . . . controller
150 . . . side-stand switch (example of "external switch" of the present invention)

The invention claimed is:

1. A battery apparatus to be installed in a vehicle, comprising:
    an energy storage device which supplies power to a load including an engine starter;
    a current breaker which cuts off a current from the energy storage device to the load; and
    a controller,
    wherein the controller:
        when detecting a parking state of the vehicle, performs a current cutoff processing which cuts off the current from the energy storage device to the load by causing the current breaker to operate;
        after performing the current cutoff processing and when detecting a pre-motion, which a user performs for the vehicle before starting driving, releases the current cutoff by releasing the operation of the current breaker, and
        after releasing the operation of the current breaker in response to the detection of the pre-motion, causes the current breaker to operate again to cutoff the current from the energy storage device to the load if the vehicle does not transition from the parking state to a driving state within a predetermined period.

2. The battery apparatus according to claim 1, wherein:
    the apparatus further comprises a displacement detector which detects a displacement of the battery apparatus, and
    when a displacement of the battery apparatus is detected during parking of the vehicle, the controller determines that the pre-motion is executed.

3. The battery apparatus according to claim 1, wherein the controller determines an execution of the pre-motion based on an output of an external switch which operates in response to the pre-motion.

4. The battery apparatus according to claim 3, wherein the external switch is a mechanical switch which is disposed on the vehicle.

5. The battery apparatus according to claim 1, wherein:
the apparatus further comprises a current detector which detects a current of the energy storage device, and
the controller determines that the vehicle is in the parking state if a state where a current of a predetermined value or more does not flow continues for a predetermined period.

6. The battery apparatus according to claim 1, wherein:
the apparatus further comprises a displacement detector which detects a displacement of the battery apparatus, and
the controller determines that the vehicle is in the parking state if a state where the battery apparatus is not displaced continues for a predetermined period.

7. The battery apparatus according to claim 1, wherein, when detecting that the vehicle is in the parking state and that a capacity of the energy storage device reaches a predetermined value, the controller performs the current cutoff processing to cut off the current from the energy storage device to the load by causing the current breaker to operate.

8. The battery apparatus according to claim 1, wherein, after performing the current breaker, the controller detects the pre-motion, releases the current cutoff if the battery apparatus is normal, and does not release the current cutoff if the battery apparatus is abnormal.

9. The battery apparatus according to claim 8, wherein, in addition to a case where the parking state of the vehicle is detected, the controller performs the current cutoff processing to cut off the current from the energy storage device to the load by causing the current breaker to operate in a case where an abnormality of the battery apparatus is detected.

10. The battery apparatus according to claim 1, wherein the energy storage device is a lithium-ion secondary battery.

11. A vehicle which installs a battery apparatus, wherein the battery apparatus comprises:
an energy storage device which supplies power to a load including an engine starter;
a current breaker which cuts off a current from the energy storage device to the load; and
a controller,
wherein:
the controller:
when detecting a parking state of the vehicle, performs a current cutoff processing which cuts off the current from the energy storage device to the load by causing the current breaker to operate; and
after performing the current cutoff processing and when detecting a pre-motion, which a user performs for the vehicle before starting driving, releases the current cutoff by releasing the operation of the current breaker, and
the battery apparatus is arranged in the vehicle such that the battery apparatus is not exposed to outside.

12. The vehicle according to claim 11, wherein the vehicle is a motorcycle.

13. The vehicle according to claim 12, wherein the pre-motion is at least one of: flipping up a side-stand or a center-stand of the motorcycle; raising an inclination of the motorcycle; or vibrating of a vehicle body caused by the user getting to a seat.

14. An automatic vehicle which installs a battery apparatus, wherein the battery apparatus comprises:
an energy storage device which supplies power to a load including an engine starter;
a current breaker which cuts off a current from the energy storage device to the load; and
a controller,
wherein:
the controller:
when detecting a parking state of the vehicle, performs a current cutoff processing which cuts off the current from the energy storage device to the load by causing the current breaker to operate; and
after performing the current cutoff processing and when detecting a pre-motion, which a user performs for the vehicle before starting driving, releases the current cutoff by releasing the operation of the current breaker, and
the battery apparatus is arranged in the vehicle such that the battery apparatus is surrounded with a seat or covers that the automatic vehicle has.

* * * * *